United States Patent
Takaku

(10) Patent No.: US 6,425,168 B1
(45) Date of Patent: *Jul. 30, 2002

(54) QUARTZ GLASS JIG FOR HEAT-TREATING SEMICONDUCTOR WAFERS AND METHOD FOR PRODUCING SAME

(75) Inventor: Toshiaki Takaku, Fukushima-ken (JP)

(73) Assignee: Shin-Etsu Handotai Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1050 days.

(21) Appl. No.: 08/531,023

(22) Filed: Aug. 20, 1995

(30) Foreign Application Priority Data

Sep. 30, 1994 (JP) .............................. 6-259829

(51) Int. Cl.[7] ..................... H01L 21/00; H01L 21/64; C23C 16/00; B05C 13/00
(52) U.S. Cl. ..................... 29/25.01; 118/500; 118/728
(58) Field of Search ..................... 437/925; 29/25.01; 118/500, 728

(56) References Cited

U.S. PATENT DOCUMENTS

| | | | | |
|---|---|---|---|---|
| 3,943,015 A | * | 3/1976 | Ing .............................. | 148/188 |
| 4,582,020 A | * | 4/1986 | Learn et al. ................. | 118/728 |
| 4,597,989 A | * | 7/1986 | Wonsowicz et al. .......... | 427/99 |
| 4,912,360 A | * | 3/1990 | Meyer .......................... | 313/1 |
| 5,048,800 A | * | 9/1991 | Miyazaki et al. ............. | 266/256 |
| 5,370,371 A | * | 12/1994 | Miyagi et al. ............... | 266/256 |
| 5,480,300 A | * | 1/1996 | Okoshi et al. ............... | 432/241 |
| 5,497,727 A | * | 3/1996 | Mayeda et al. .............. | 118/733 |
| 5,560,775 A | * | 10/1996 | Conboy et al. .............. | 118/500 |
| 5,571,333 A | * | 11/1996 | Kanaya ....................... | 118/724 |
| 5,585,148 A | * | 12/1996 | Suzuki et al. ................ | 497/572 |

FOREIGN PATENT DOCUMENTS

| | | | |
|---|---|---|---|
| DE | A-33353950 | | 4/1985 |
| JP | 55-127021 | * | 1/1980 |
| JP | 63-17288 | * | 1/1988 |
| JP | 63-123892 | * | 5/1988 |
| JP | 3-159128 | * | 7/1991 |
| JP | 91-187954 | * | 8/1991 |
| JP | 7-58013 | * | 3/1995 |
| JP | 8102443 | * | 4/1996 |

OTHER PUBLICATIONS

T. Hamaguchi 'device layer transfer technique using chemi--mechanical polishing' *figures 2,4* Jap.Journal.Appl. Phys., vol. 23, No. 10, Oct. 1984, Tokyo pp. L815–L817.

* cited by examiner

*Primary Examiner*—David E Graybill
(74) *Attorney, Agent, or Firm*—Baker & Daniels

(57) ABSTRACT

A reaction tube without occurrence of crack or breakdown or a wafer boat without generation of particles is provided, such various faults being caused by the difference between the thermal expansion coefficients of a thin film and one of those quartz glass jigs.

The present invention is applied to a quartz glass jig used in a thermal CVD apparatus, and is characterized in that the jig is made of transparent quartz glass material, and that the portion or portions exposed to the heat treatment space or the portions contacting with wafers are sand-blasted.

The reason why transparent quartz glass is limited as the material is that, in case of transparent quartz glass, the surface hardness is more uniform in comparison to bubble-mixed or opaque quartz glass and thus a predetermined surface roughness is more effectively achieved by sand-blasting so that the faults as mentioned above due to the stress occurring in the treatment between a CVD film and one of the quartz glass jigs are effectively prevented.

6 Claims, 3 Drawing Sheets

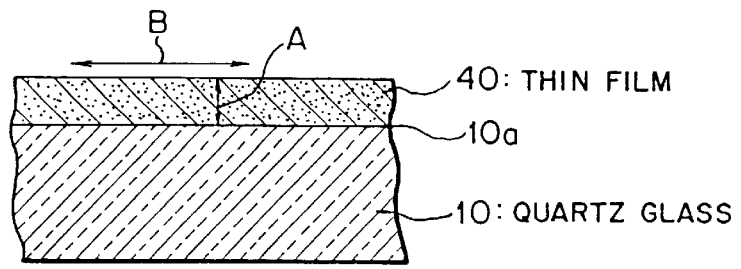
FIG.3(a)
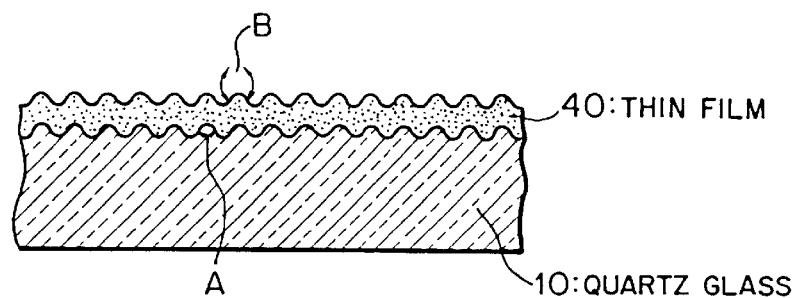
FIG.3(b)
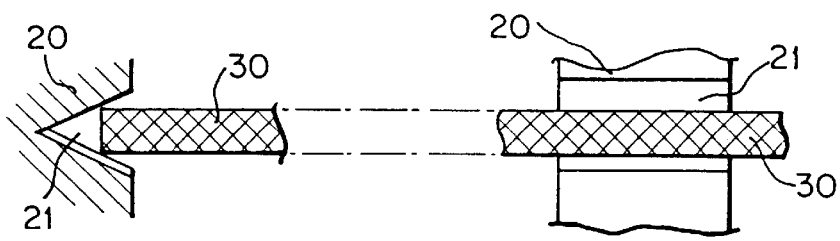
FIG.4(a)
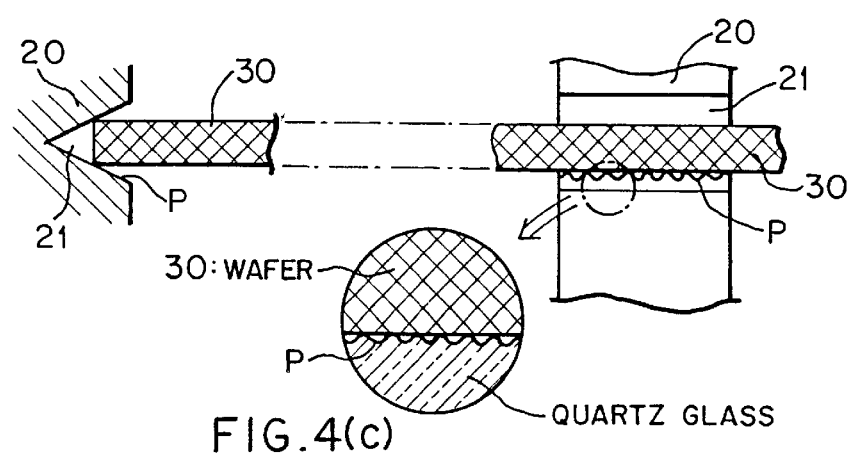
FIG.4(b)
FIG.4(c)

QUARTZ GLASS JIG FOR HEAT-TREATING SEMICONDUCTOR WAFERS AND METHOD FOR PRODUCING SAME

BACKGROUND OF THE INVENTION

1. Field of the Invention

The present invention relates to a quartz glass jig, such as a quartz glass reaction tube (hereinafter referred to as a reaction tube) and a quartz glass wafer boat (hereinafter referred to as a wafer boat) that are used in a heat-treatment apparatus for semiconductor wafers, such as a CVD apparatus or a thermal diffusion apparatus.

More particularly, the present invention relates to a quartz glass jig, such as a reaction tube or a wafer boat, used in a thermal CVD apparatus.

2. Related Prior Art

Conventionally a CVD apparatus was well known in which a chemical reaction in a activated space was used to form a thin film on a wafer or wafers.

There are, for example, a thermal CVD apparatus, a plasma CVD apparatus and a photo-assisted CVD apparatus which respectively use heat, plasma and ultraviolet light or laser as activation energies.

In a thermal CVD apparatus, vapor phase chemical reaction (for example, thermal decomposition, hydrogen reduction, oxidation or substitution reaction) at a high temperature of a volatile metal hologenide, a volatile metal organic compound or the like is conducted to form an epitaxial film made of semiconductor such as silicon or a metal having a high melting point, or an insulating film or a protection film made of the oxide of semiconductor such as silicon on a wafer or wafers.

Jigs such as a reaction tube and a wafer boat used in such CVD apparatuses are generally made of quartz glass from the requirements for chemical stability and heat resistance.

In the vapor phase growth, since the surface or surfaces of a quartz glass jig are exposed to a vapor phase growth space in the apparatus, a thin film or films adhere on the surface or surfaces of the jig as well as the surface of a wafer or wafers.

A reaction temperature of the vapor phase chemical reaction required for thermal decomposition of $SiH_4$, which is used for formation of a Si thin film in a thermal CVD method, is in the range of 500° C. to 1100° C.

A reaction temperature of the vapor phase chemical reaction for reduction of $SiCl_4$ is upto 1200° C.

What's more, because the thermal expansion coefficients of a Si film and quartz glass, which is the material of a reaction tube, are different from each other by one figure or so, the film has a risk to get separate due to a stress caused by the difference between the expansion coefficients, when a CVD film is thin.

On the other hand, when the CVD film is thick and the stress affecting the quartz glass of the reaction tube is larger, the reaction tube, this time, has a risk to break.

This is also the case with not only a CVD apparatus but also a diffusion furnace in which the heat-treatment space is under influence of a high temperature of about 1200° C., and especially the above-mentioned adverse effects is conspicuously observed in a CVD apparatus in which thin films adhere on surfaces.

In the case of a wafer boat in the reaction tube aforementioned where wafers are disposed in a stacking manner at respective predetermined positions, boat marks (which means poor exterior appearance observed on the surface or surfaces of a wafer caused by contacting with the boat and sometimes are accompanied by chipping along the periphery of a wafer) often occur at a contacting portion or portions between the periphery of each of the wafers and the boat, because the peripheries of the wafers and the boat are in the contacting conditions of planes or lines and move over each other with friction due to the difference between the thermal expansion coefficients.

SUMMARY OF THE INVENTION

The present invention was made to solve the technical faults of the prior art.

It is an object of the present invention to provide a quartz glass jig used for a heat-treatment apparatus for semiconductor wafers, in particular a CVD apparatus, and a method for producing the jig that can solve various faults caused by the difference between the thermal expansion coefficients of the aforementioned thin film and the quartz glass jig.

It is another object of the present invention to provide a reaction tube to be used in a CVD apparatus in which neither crack nor breakdown occurs, even when a thin film adheres on the internal wall or walls of the reaction tube.

It is a further object of the present invention to provide a wafer boat to be used in a CVD apparatus in which neither boat mark on nor chippings along the periphery of a wafer or wafers occur.

The present invention is applied to a quartz glass jig to be used in a heat-treatment apparatus, in particular a CVD apparatus, and is characterized in that the jig is made of transparent quartz glass as the material and that sand-blasting is given on the portion or portions exposed to the heat-treatment space.

The reason why the material of the jig is limited to transparent quartz glass is that transparent quartz glass has a more uniform surface hardness in comparison with bubble-mixed or opaque quartz glass and a desired surface roughness is effectively achieved in sand-blasting, so that the faults resulted from the stress occurred between the CVD film and a treated surface or surfaces of the jig are effectively prevented.

In the present invention, in a more concrete manner, in the case of a reaction tube 1 used in a thermal CVD apparatus in FIG. 1, at least the portion or portions which are heated by a heater 2 of the internal wall 10a are preferably sand-blasted and in the case of a wafer boat 20 used in a thermal CVD apparatus in FIG. 2, at least the portions of the wafer boat 20 that contact with each wafer 30 are preferably sand-blasted.

According to the present invention, the center-line mean roughness (Ra) of the surface after sand-blasting is set in the range of 1 $\mu$m to 20 $\mu$m, preferably 2 $\mu$m to 10 $\mu$m, more preferably 3 $\mu$m to 5 $\mu$m. It is still more preferable that the maximum height (Rmax) is roughly set in the range of 10 $\mu$m to 30 $\mu$m, while the center-line mean roughness (Ra) is set in the range of 3 $\mu$m to 5 $\mu$m.

Abrasive material used in sand-blasting is made of a material or a mixture of materials that are harder than quartz glass and do not become a contamination source or sources, for example, crystallized quartz powders or SiC powders and the grit size distribution is preferably set so that the weight in the range of 100 $\mu$m to 400 $\mu$m in grit size is at 90% of the total weight.

Such a function of the present invention will be explained in reference to FIG. 3(a) and FIG. 3(b) below:

For example, a case that a poly silicon film 40 adheres on the internal wall surface 10a of a reaction tube 10 in a CVD method is here considered referring to FIG. 3(a).

Since the linear expansion coefficient of Si is 4.7×10⁻⁶/° C. to 4.9×10⁻⁶/° C. and that of SiO2 is 5.5×10⁻⁷/° C., thermal contraction of the poly silicon thin film 40 occurs, but that of quartz almost no way occur, when the temperature is lowered from any in the range of 550° C. to 770° C. to room temperature of 20° C. during CVD growth.

In this circumstance, the poly silicon thin film 40 makes a compressive stress A occur in the quartz glass 10 and on the other hand the quartz glass 10 makes a tensile stress B occur in the poly silicon thin film 40.

The thermal stress A, which the poly silicon thin film 40 gives to the quartz glass 10, accordingly is obtained from the following equation:

$$A = E(\alpha_1 - \alpha_2)\Delta T = (1.9 \sim 2.4) \times 10^8 \text{dyne/cm}^2,$$

where E: Young's modulus of poly silicon thin film 40 (0.9×10¹¹dyne/cm²)

α1: linear expansion coefficient of poly silicon thin film 40 (4.5–10⁻⁶/° C.)

α2: linear expansion coefficient of quartz (5.5×10⁻⁷/° C.)

ΔT: (550~700)−20=530~680° C.

If the thermal stress A is (1.9~2.4)×10⁸ dyne/cm², this value exceeds the design stress for a reaction tube and the breakdown thereof thus becomes a real risk, in the case that the dimensions of the reaction tube are set at respectively 350 mm in diameter and 4 mm~5 mm in the thickness of the wall.

In the mean time, when the surface of the quartz glass 10 is sand-blasted, the surface is roughened to show a level of irregularity as shown in FIG. 3(b).

If a CVD treatment is carried out in this state, a poly silicon thin film 40 is formed on the surface in conformity with the roughened surface profile.

Such a poly silicon thin film 40 forms a compression stress B in the surface of the quartz glass which has a serrate contour in correspondence to the irregularity of the original surface of the quartz 10.

This causes divergence of the stress in the quartz glass.

On the side of the quartz glass 10, the peaks in the surface irregularity of the quartz glass 10 does not have enough strength and, therefore, with the stress A occurring on the side of the quartz glass 10, only the peaks are broken down and the propagation of the stress into the bulk is stopped within the vicinity of the surface, so that the break-down and a crack or cracks of the quartz glass can be prevented.

In the case of a wafer boat installed in the aforementioned reaction tube with which wafers 30 are disposed in a stacking manner at respective predetermined positions, the wafers 30 have each a linear contact relation in the holding groove 21, which is formed in the wafer boat 20 together with a plurality of the other same grooves 21.

The difference therebetween in the thermal coefficients causes boat marks on or chippings at the peripheries of the wafers 30.

If a wafer boat is made of transparent quartz glass material which is excellent in flatness and smoothness, this faults are increased more, because of occurrence of a linear contact relation, which puts a wafer in a closer geometrical condition with the boat.

By sand-blasting the internal surfaces of a holding groove 21 mentioned above, which is formed in the wafer boat 20, since the wafer 30 is placed on the peaks of the surface irregularity as illustrated in FIG. 4(b), the wafer 30 and the wafer boat 20 are a point contact relation with each other at a point P, and the wafer 30 does not run a risk to have boat mark or chippings thereon due to divergence of the thermal stress acting in the surface of the wafer 30, which would otherwise acts straight.

BRIEF DESCRIPTION OF THE DRAWINGS

Other objects and aspects of the present invention will become apparent from the following description of embodiments with reference to the accompanying drawings in which:

FIG. 3(a) is an enlarged cross-sectional view of a portion of a reaction tube where a thin film is adhered and FIG. 3(b) is an illustrative view of a technology adopting sand-blasting according to the present invention and;

FIG. 4(a) is an enlarged cross-sectional view showing a structural detail of a contacting state between a wafer and the holding groove, which supports the wafer, and FIG. 4(b) is a illustrative view of a technology adopting sand-blasting according to the present invention.

DETAILED DESCRIPTION OF THE INVENTION

An embodiment of the present invention will be illustratively in detail described in reference to the accompanying drawings below:

It should be understood that the sizes, materials, shapes, relative configuration and the like of the structural parts recited in the embodiment do not intend to limit the scope of the present invention and they are only exemplified, unless otherwise specified.

Figure 1:
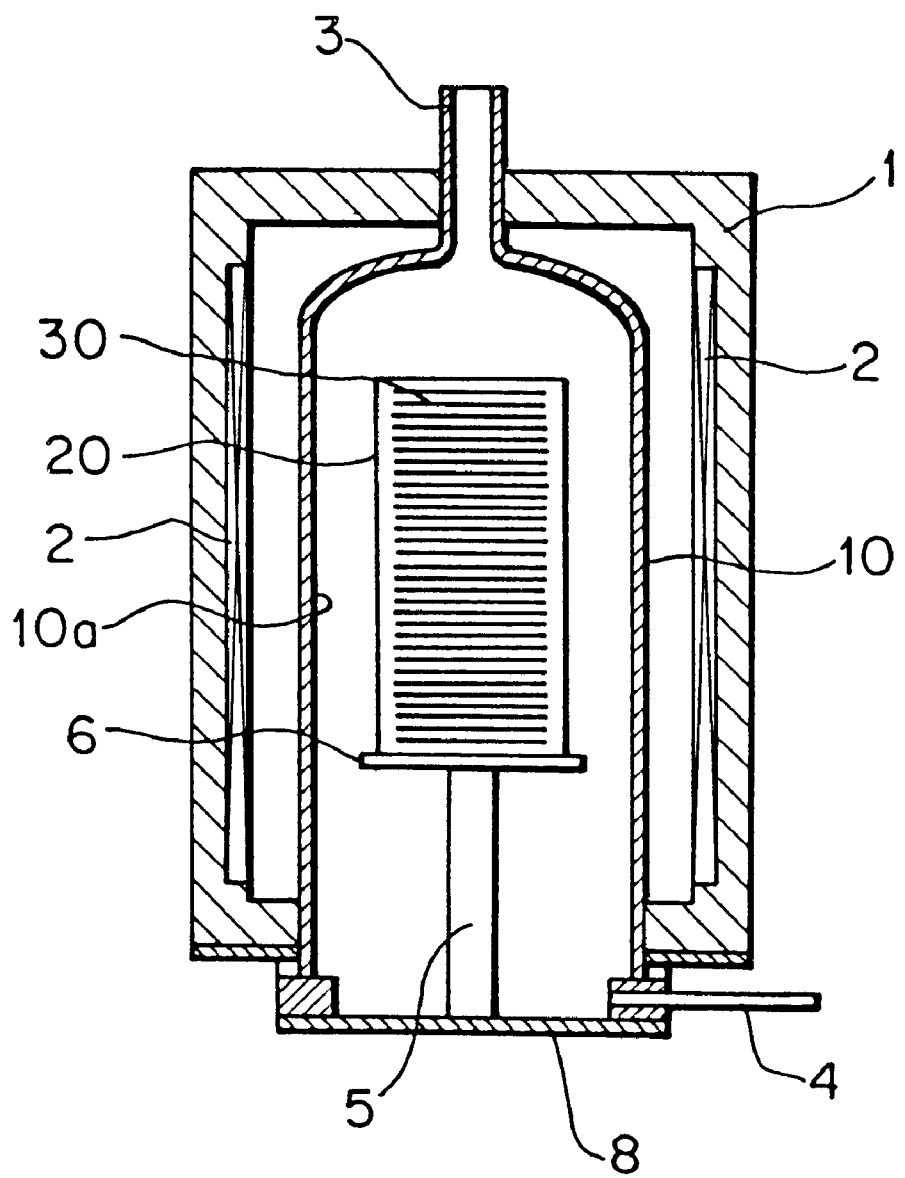
FIG. 1 is a schematic view of a CVD apparatus to which the present invention is applied.

FIG. 1 is a schematic view of a CVD apparatus to which the present invention is applied.

A numeral 1 indicates a cylindrical furnace body, which is posed almost in a vertical position, the top of which is sealed, the lower end of which is open, and on the internal wall of which a heater 2 is equipped.

A numeral 10 indicates a transparent quartz glass furnace tube, at the top of which a gas outlet pipe 3 is attached being projecting outwardly of the furnace body 1, the lowest portion of which is extended outwardly of the lower surface of the furnace body 1, and on the extended lowest portion of which a gas inlet pipe 4 is attached.

In the reaction tube 10, there are a supporting plate 6 horizontally posed on a supporting shaft 5, which is shiftable vertically and rotatable by a drive mechanism not shown, and a wafer boat 20 made of transparent quartz glass, which is held on the supporting plate 6.

Figure 2A:
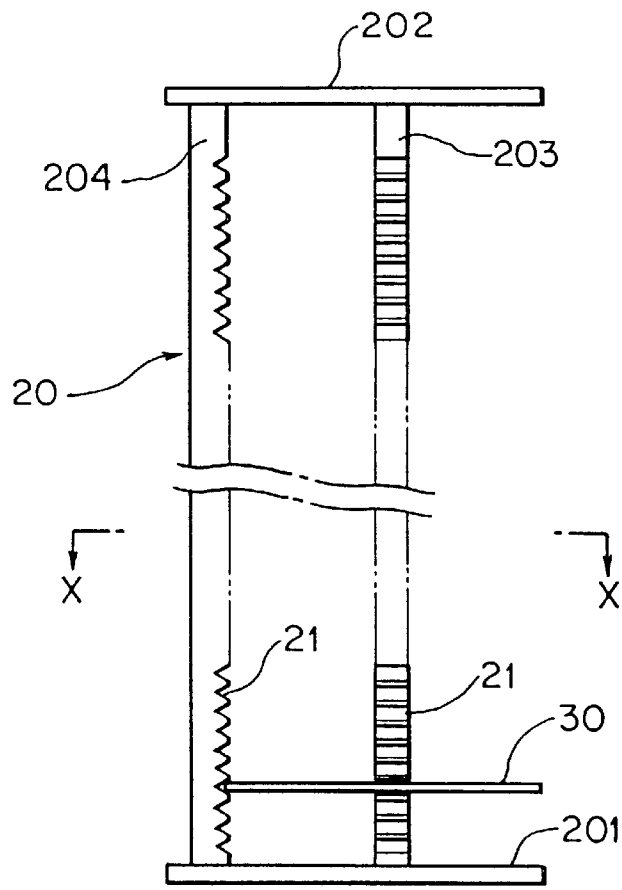
FIG. 2(a) is a schematic front view of a vertical wafer boat to which the present invention is applied.
Figure 2B:
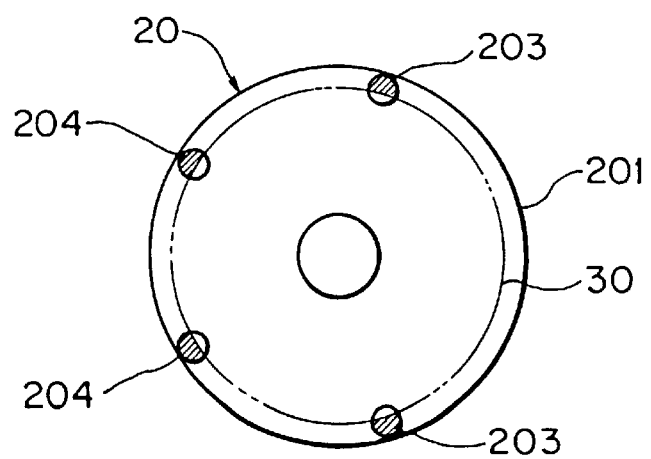
FIG. 2(b) is a cross-sectional view taken on line X—X of FIG. 2(a)

The wafer boat 20 includes, as shown in FIG. 2(a) and FIG. 2(b), a disk-like bottom plate 201 and a disk-like top plate 202, which are disposed in a relation of one above the other.

A pair of side poles 203 and a pair of back poles 204 are stood between the bottom plate 201 and top plate 202.

A plurality of holding grooves 21 are carved in and along the side poles 203 and back poles 204 so that the wafers 30 are horizontally and in a stacking manner disposed therein.

In such a well known CVD apparatus, the supporting shaft 5 is shifted downwardly to position the supporting plate 6 at a position under the furnace body, the wafer boat loaded with the wafers 30 is then put on the supporting plate 6, and thereafter the supporting shaft 5 is shifted upwardly with the wafers 30 so as to hermetically seal the furnace tube 10 with a sealing plate 8 and at the same time to locate the wafer boat 20 at a predetermined position in the furnace tube 10.

In this state, the atmosphere in the reaction tube 10 is replaced with an inert gas and then the pressure is adjusted under vacuum. Thereafter, a predetermined vapor phase growth is performed by supplying a reaction gas, while the temperature is controlled at a predetermined level in the range of 550° C. to 700° C. by a heater 2.

In the apparatus, the diameter of the furnace tube was set at 350 mm and the thickness of the wall was set at 4 mm to 5 mm, mono-silane gas as the reaction gas was supplied to conduct a predetermined vapour phase growth at a temperature of 550° C. to 700° C.

The heat-treatment was continued to adhere a poly silicon thin film 40 of 40 μm thick on the reaction tube 40 and then the temperature was lowered to room temperature.

Cracks were inspected in the reaction tubes 10 and in any of the five experiments, a crack or cracks in the reaction tubes were confirmed to occur.

The wafers which were treated in the same conditions as in the above experiments (in batch wise operations each treating 60 wafers) were inspected about whether or not a boat mark or boat marks occurred in each of the batches.

The percentages of the wafers on which the boat mark or boat marks observed in each of the batches were in a range of 40% to 100% of all the 60 wafers each.

Then, in another group of experiments, the internal surfaces 10a of the reaction tubes 10 and all the surfaces of the wafer boats 20 each including the inside of every holding groove were sand-blasted in the following conditions.

A heat-treatment was conducted to adhere a poly silicon thin of 40 μm thick on the reaction tube 10 in the same conditions as the above experiments and then cracks in the reaction tubes 10 were inspected. In the five experiments, cracks were prevented in any of the reaction tubes used.

The heat-treatment was continued in a further experiments until a poly silicon film of 80 μm thick adhered on the reaction tubes 10 and the temperature was then lowered down to room temperature, no crack was able to be observed in any of the reaction tubes 10 in inspection.

The wafers treated in the conditions as mentioned above, which were treated in batch wise operations with each batch of 60 wafers, were inspected with regard to boat mark or boat marks in each batch.

The results were that no boat mark was observed in any of the batches.

The used abrasive material was crystallized quartz powders, in other words rock crystal powders, and the grit size distribution was shown in Table 1.

TABLE 1

Grit Size Distribution of Crystallized Quartz Powders

| Grit Size Range μm | Weight % |
|---|---|
| ~300 | 5 |
| 300~250 | 21 |
| 250~212 | 33 |
| 212~180 | 6 |
| 180~150 | 23 |
| 150~106 | 10 |
| 106~ | 2 |

The surface roughness were respectively measured at 10 points in total each on the internal wall surface 10a of one of the reaction tube 10 and on the internal surfaces of ten wafer holding grooves 21 of all.

The center-line mean roughness (Ra) of the reaction tube 10 was 3.5 μm and the maximum height (Rmax) was 20 μm.

The center-line mean roughness (Ra) of the wafer boat was 4.5 μm and the maximum height (Rmax) was 25 μm.

The conditions for measurement of the surface roughness are as follows:

The cut-off value is set at 0.8 mm.

The reference length in determination of a maximum height is set at 2.5 mm.

Then, crystallized quartz powders with a grit size distribution of 90% by weight in the size range of 100 μm to 200 μm were used for sand-blasting for wafer boats 20.

In the same CVD treatment as described above, heat-treatments of 4 batches each composed of 60 wafers were carried out. The boat mark or boat marks on the wafers were inspected in each of the batches and at most one wafer per batch showed a boat mark or boat marks thereon, which is a faint one.

In this case, Ra was 1.8 μm and Rmax was 15 μm, where the cut-off was set at 0.5 mm and the reference length was 2.5 mm.

Since a wafer held by a wafer boat 20 is so positioned as to have a periphery edge of the wafer contact with the holding groove 21 in a line, there is a risk that particles are produced if the center-line mean roughness Ra on the surfaces of the grooves 21 exceeds 20 μm.

The Ra is preferably set in the range of 2 μm to 10 μm, more preferably 3 μm to 5 μm and the Rmax is preferably set roughly in the range of 10 μm to 30 μm.

According to the present invention, as described above, various faults caused by the difference between a thin film 40 and a quartz glass jig are solved and a favorable vapor phase growth can especially be conducted in a CVD apparatus.

Further, in the case that the present invention is applied to a reaction tube 10, not only a crack or break down but also separation of a thin film 40 does not occur, even when the thin film 40 adheres on the internal wall surface of a reaction tube 10 in a CVD treatment.

Still further, in the case that the present invention is applied to a wafer boat 20, the wafer boat 20 with which neither boat mark nor chipping on wafers 30, nor particle caused by chippings occurs can be provided.

I claim:

1. In a thermal chemical vapor deposition apparatus having a quartz glass reaction tube that is used for heat-treating semiconductor wafers, the improvement which comprises:

making the quartz glass reaction tube from transparent quartz glass; and providing the quartz glass reaction tube with at least one sand-blasted internal wall surface portion, which at least one sand-blasted internal wall surface portion has a center-line mean roughness in the range of 1 μm to 20 μm and is heated by a heater during heat-treatment.

2. A thermal chemical vapor deposition apparatus according to claim 1, wherein the at least one sand-blasted internal wall surface portion has a center-line mean roughness in the range of 2 μm to 10 μm.

3. A thermal chemical vapor deposition apparatus according to claim 1, wherein the at least one sand-blasted internal wall surface portion is sand-blasted with an abrasive material that is harder than the quartz glass reaction tube and is free from contamination of the abrasive material.

4. A thermal chemical vapor deposition apparatus according to claim 2, wherein the at least one sand-blasted internal wall surface portion is sand-blasted with an abrasive material that is harder than the quartz glass reaction tube and is free from contamination of the abrasive material.

5. A thermal chemical vapor deposition apparatus according to claim 3, wherein the abrasive material is quartz powder or SiC powder.

6. A thermal chemical vapor deposition apparatus according to claim 4, wherein the abrasive material is quartz powder or SiC powder.

* * * * *